US009499924B2

(12) United States Patent
Kimura et al.

(10) Patent No.: US 9,499,924 B2
(45) Date of Patent: Nov. 22, 2016

(54) METHOD FOR MANUFACTURING SILICON SINGLE CRYSTAL

(75) Inventors: Akihiro Kimura, Nishishirakawa (JP); Kiyotaka Takano, Nishishirakawa (JP); Junya Tokue, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 341 days.

(21) Appl. No.: 14/236,977

(22) PCT Filed: Aug. 2, 2012

(86) PCT No.: PCT/JP2012/004903
§ 371 (c)(1),
(2), (4) Date: Feb. 4, 2014

(87) PCT Pub. No.: WO2013/031091
PCT Pub. Date: Mar. 7, 2013

(65) Prior Publication Data
US 2014/0174339 A1    Jun. 26, 2014

(30) Foreign Application Priority Data

Sep. 1, 2011   (JP) .................. 2011-190680

(51) Int. Cl.
*C30B 15/10* (2006.01)
*C30B 15/22* (2006.01)
*C30B 15/00* (2006.01)
*C30B 29/06* (2006.01)

(52) U.S. Cl.
CPC .............. *C30B 15/22* (2013.01); *C30B 15/00* (2013.01); *C30B 15/10* (2013.01); *C30B 29/06* (2013.01)

(58) Field of Classification Search
CPC ........ C30B 15/10; C30B 15/14; C30B 15/20
See application file for complete search history.

(56) References Cited

U.S. PATENT DOCUMENTS 5,980,629 A * 11/1999 Hansen ................ C30B 15/10
117/13
6,001,170 A * 12/1999 Tomzig ................ C30B 15/305
117/208
6,086,671 A    7/2000 Kawanishi et al.
8,277,559 B2 * 10/2012 Ohama ................ C03B 19/095
117/13
2006/0236916 A1 * 10/2006 Ohama ................ C03B 19/095
117/13
2009/0090295 A1    4/2009 Hwang et al.
2011/0271898 A1    11/2011 Iida et al.

FOREIGN PATENT DOCUMENTS

| JP | A 10-297994 | 11/1998 |
| JP | A 11-199365 | 7/1999 |
| JP | A 2001-240494 | 9/2001 |
| JP | A 2002-179494 | 6/2002 |
| JP | 2004-189557 A | 7/2004 |
| JP | 2007-001819 A | 1/2007 |
| JP | A 2009-91233 | 4/2009 |
| JP | A 2010-30816 | 2/2010 |
| JP | A 2010-208908 | 9/2010 |

OTHER PUBLICATIONS

Apr. 28, 2015 Office Action issued in Japanese Patent Application No. 2013-531018.
Oct. 16, 2012 Search Report issued in International Patent Application No. PCT/JP2012/004903 (with translation).

* cited by examiner

Primary Examiner — Robert M Kunemund
(74) Attorney, Agent, or Firm — Oliff PLC

(57) ABSTRACT

There is provided a method for manufacturing a silicon single crystal, the method includes: a raw material melting step of melting polycrystalline silicon accommodated in a crucible to obtain a silicon melt; and bringing a seed crystal into contact with the silicon melt and pulling up the seed crystal to grow the silicon single crystal, wherein, after the raw material melting step and before the pulling step, there are performed: a cristobalitizing step of leaving the silicon melt at a predetermined number of rotations of the crucible with a predetermined gas flow rate and a predetermined furnace pressure to generate cristobalite while applying a magnetic field; and a dissolving step of partially dissolving the cristobalite by carrying out any one of an increase in number of rotations of the crucible, an increase in gas flow rate, and a reduction in furnace pressure beyond counterpart figures in the cristobalitizing step.

18 Claims, No Drawings

METHOD FOR MANUFACTURING SILICON SINGLE CRYSTAL

TECHNICAL FIELD

The present invention relates to a method for manufacturing a silicon single crystal based on the Czochralski method.

BACKGROUND ART

The Czochralski method has been conventionally widely adopted for growth of a silicon single crystal. Among others, the MCZ method (the magnetic field applied Czochralski method) for applying a magnetic field to a silicon melt in order to suppress a convection current of a silicon melt in a quartz crucible has been known. In the MCZ method, a silicon single crystal is grown by performing a melting step of accommodating polycrystalline silicon in a quartz crucible and melting the polycrystalline silicon in the quartz crucible with use of a heater and a pulling step of bringing a seed crystal into contact with a melt surface of the silicon melt from above, rotating and moving up and down the seed crystal and the quartz crystal while applying a magnetic field to the silicon melt with use of a coil, and pulling the seed crystal.

The quartz crucible configured to accommodate the silicon melt therein is made of amorphous $SiO_2$ (quartz glass) having an amorphous structure. The quartz crucible reacts with the silicon melt, and a cristobalite crystal layer, which is crystalline $SiO_2$, is formed on a $SiO_2/Si$ interface, i.e., an inner surface of the quartz crucible that is in contact with the silicon melt. In some cases, the cristobalite crystal layer is exfoliated during pulling up the silicon single crystal, liberated or allowed to fall into the silicon melt from the quartz crucible, and reaches a growth interface of a silicon single crystal that is being pulled up. As a result, the cristobalite crystal layer enters the silicon single crystal that is being pulled up, and it may cause dislocation generation of the silicon single crystal.

Thus, to prevent exfoliation of cristobalite from the inner surface of the quartz crucible during the silicon single crystal pulling step and avoid the dislocation generation of the silicon single crystal, various methods have been suggested. For example, Patent Literature 1 discloses a method for growing a silicon single crystal while applying a magnetic field to a silicon melt with use of a quartz crucible having an aluminum low concentration layer on an inner surface side.

However, according to the method disclosed in Patent Literature 1, a problem lies in that the aluminum low concentration layer (an impurity layer) is formed in the quartz crucible and hence this impurity is contained in the silicon single crystal. If the impurity is contained in the silicon single crystal, an influence on a device is a concern, and hence forming the impurity layer on an inner surface of the quartz crucible is not preferable. Especially, this is particularly undesirable solving means for a next-generation device that is expected to achieve high purity.

Further, Patent Literature 2 discloses intermittently applying a magnetic field to a silicon melt to control a size of cristobalite. However, to intermittently apply a magnetic field to the silicon melt more than once, magnetization and demagnetization of a coil must be repeated, this operation is troublesome, and a risk of operational errors is increased. Furthermore, when the magnetization and the demagnetization of the coil are repeated, a dead time that the silicon single crystal is not manufactured is increased, which is inefficient.

CITATION LIST

Patent Literatures

Patent Literature 1: Japanese Unexamined Patent Application Publication No. 2010-30816
Patent Literature 2: Japanese Unexamined Patent Application Publication No. 2001-240494
Patent Literature 3: Japanese Unexamined Patent Application Publication No. H10-297994

SUMMARY OF INVENTION

Technical Problem

In view of the above-described problem, it is an object of the present invention to provide a silicon single crystal manufacturing method that suppresses generation of a dislocation at the time of manufacturing the silicon single crystal.

Solution to Problem

To achieve the object, according to the present invention, there is provided a method for manufacturing a silicon single crystal, the method comprising: a raw material melting step of melting polycrystalline silicon accommodated in a crucible to obtain a silicon melt; and a pulling step of bringing a seed crystal into contact with a melt surface of the silicon melt and pulling up the seed crystal to grow the silicon single crystal, wherein, after the raw material melting step and before the pulling step, there are performed: a cristobalitizing step of leaving the silicon melt at a predetermined number of rotations of the crucible with a predetermined gas flow rate and a predetermined furnace pressure to generate cristobalite on a surface of the crucible while applying a magnetic field; and a dissolving step of partially dissolving the cristobalite by carrying out any one of an increase in number of rotations of the crucible, an increase in gas flow rate, and a reduction in furnace pressure beyond counterpart figures in the cristobalitizing step.

According to such a method for manufacturing a silicon single crystal, when the surface of the crucible on which cristobalite was once generated is daringly appropriately dissolved and an ideal surface state of the crucible is produced, the silicon single crystal manufacturing method that suppresses generation of a dislocation is provided.

Moreover, the same magnetic field as that in the cristobalitizing step can be applied at the dissolving step.

As described above, cristobalite can be partially dissolved by just performing, e.g., an increase in the number of rotations of the crucible while keeping the cristobalitizing step and the application of the magnetic field, and hence a dead time that the silicon single crystal is not manufactured can be shortened.

Additionally, at the cristobalitizing step, it is preferable to adjust the number of rotations of the crucible to 3 rpm or less, adjust the gas flow rate to 250 L/min or less, and adjust the furnace pressure to 80 hPa or more.

When the adjustment is carried out in this manner, the cristobalite is appropriately produced, and dislocation generation can be further effectively avoided.

Further, it is preferable to perform the cristobalitizing step for one hour or more.

When such a time period is provided, it is a time that is sufficient to form the cristobalite on the surface of the crucible, and it is also a sufficiently short time in terms of efficiency.

Furthermore, at the dissolving step, it is preferable to increase the number of rotations of the crucible to 5 rpm or more, increase the gas flow rate to 300 L/min or more, and reduce the furnace pressure to 70 hPa or less.

When the adjustment is carried out in this manner, the cristobalite is appropriately dissolved, and the dislocation generation can be further effectively avoided.

Moreover, it is preferable to perform the dissolving step for one hour or more and nine hours or less.

As described above, when the time of the dissolving step is one hour or more, dissolution can be sufficiently carried out to the extent that the cristobalite is not exfoliated and, even if the cristobalite is exfoliated, the exfoliated cristobalite becomes sufficiently thin to be dissolved in the silicon melt before it reaches a solid-liquid interface. Additionally, when the time of the dissolving step is nine hours or less, it is possible to prevent the generated cristobalite from being entirely dissolved and also prevent new nucleation of the cristobalite from occurring.

Further, it is preferable to use a horizontal magnetic field as the magnetic field to be applied and set intensity of a center magnetic field thereof to 3000 gausses or more and 5000 gausses or less at the cristobalitizing step, the dissolving step, or both the cristobalitizing step and the dissolving step.

As described above, when the horizontal magnetic field is applied and intensity of its center magnetic field is 3000 gausses or more, a leaving time can be shortened, which is efficient. On the other hand, application of 5000 gausses is sufficient.

Advantageous Effects of Invention

As described above, according to the method for manufacturing a silicon single crystal of the present invention, when the crucible surface on which cristobalite was once generated is daringly appropriately dissolved and the ideal crucible surface state is formed, generation of a dislocation in growth of the silicon single crystal can be suppressed. Furthermore, when an increase in number of rotations of the crucible or the like is performed without changing application of the magnetic field, the cristobalite can be partially dissolved, and hence the dead time that the silicon single crystal is not manufactured can be shortened.

DESCRIPTION OF EMBODIMENTS

An embodiment according to the present invention will now be described hereinafter, but the present invention is not restricted thereto.

As disclosed in Patent Literature 2 or Patent Literature 3, the cristobalite is formed on the surface of the crucible in an environment where the magnetic field is applied to the silicon melt, and the formed cristobalite is gradually dissolved in the silicon melt in an environment where the application of the magnetic field is stopped. In conventional examples, a problem lies in that this cristobalite is exfoliated into the silicon melt, resulting in the dislocation generation of the silicon single crystal that is in the growth process.

The present inventors applied a magnetic field of 4000 gausses to a silicon melt after end of a polycrystalline silicon melting step, left the silicon melt for one hour, then pulled a silicon single crystal based on the MCZ method, observed cristobalite formed on a surface of a crucible, and consequently found traces of exfoliation of the cristobalite near the center of a so-called a brown ring. On the other hand, after end of the polycrystalline silicon melting step, the present inventors applied a magnetic field of 4000 gausses to the silicon melt, left the silicon melt for one hour, then performed any one of an increase in the number of rotations of the crucible, an increase in gas flow rate, and a reduction in furnace pressure, and pulled the crystal based on the MCZ method, but the brown ring was not observed on the surface of the crucible since it was dissolved, a majority of the brown ring turned into amorphous silica, and dappled cristobalite was formed therein in an island-like pattern.

The number of times that dislocation generation occurs was checked with respect to 10 pieces of silicon single crystal grown based on the MCZ method immediately after applying the magnetic field and leaving the melt and 10 pieces of silicon single crystal grown based on the MCZ method after applying the magnetic field, leaving the melt, and then performing, e.g., an increase in number of rotations of the crucible, respectively. As a result, the dislocation generation occurred in all of the 10 pieces of silicon single crystal when just the magnetic field was applied and the melt was left, whereas the dislocation generation was not observed when the increase in number of rotations of the crucible was further performed after these processes.

As a result, it was understood that, when just the magnetic field is applied to the silicon melt and the silicon melt is left, the formed cristobalite is exfoliated during the pulling step and the exfoliated cristobalite reaches the solid-liquid interface during the silicon single crystal growth before it is completely dissolved into the silicon melt, thus leading to the dislocation generation of the silicon single crystal. On the other hand, it was revealed that, when the cristobalite is appropriately dissolved by performing, e.g., the increase in number of rotations of the crucible, the exfoliation of the cristobalite can be suppressed, and the dislocation generation of the silicon single crystal does not occur. Further, even if the cristobalite is exfoliated from the crucible, since a thickness of the appropriately dissolved cristobalite is small, the cristobalite is dissolved in the silicon melt without reaching the solid-liquid interface of the silicon single crystal, and the dislocation generation of the silicon single crystal during the growth does not occur.

On the surface of the crucible obtained by applying the magnetic field, leaving the silicon melt, performing, e.g., an increase in number of rotations of the crucible for a long time, completely dissolving the cristobalite, and then pulling the silicon single crystal, the brown ring was again observed, and traces of exfoliation of the cristobalite were observed near the center of the brown ring. This means that the entire surface of the crucible returns to a state close to initial amorphous silica when the cristobalite is completely dissolved, and nucleation, growth, and exfoliation of the cristobalite again occur at the time of the pulling step. That is, it suggests that new nucleation of the cristobalite hardly occurs when the cristobalite remains on the surface of the crucible, but the nucleation can occur when the entire surface is in the amorphous silica state. Thus, it was found out that, when all of the cristobalite is dissolved, the dislocation generation of the silicon single crystal possibly occurs at the time of the subsequent pulling step.

Therefore, based on the above knowledge, the present inventors conceived a view that the dislocation generation of the silicon single crystal that is in the growth process is suppressed when the surface state of the crucible before the crystal pulling step is a state that a large part of the surface of the crucible is constituted of amorphous silica and the dappled cristobalite is formed in the amorphous silica in an island-like pattern. Furthermore, they discovered that the ideal surface state of the crucible that the cristobalite is not exfoliated and new nucleation of the cristobalite does not occur can be formed by applying a magnetic field to the silicon melt, leaving the silicon melt, forming the cristobalite on the surface of the crucible, and then performing, e.g., an increase in number of rotations of the crucible to appropriately dissolve the cristobalite. Moreover, since control over, e.g., the number of rotations of the crucible can be instantaneously performed, they revealed that time loss does not occur as compared with a case where the application of the magnetic field is controlled, and a burden on an operator can be reduced. Therefore, the present inventors discovered the silicon single crystal manufacturing method that enables avoiding the dislocation generation of the silicon single crystal and hit upon the present invention. Particulars of the present invention will now be described hereinafter.

A raw material melting step according to the present invention is a step of melting polycrystalline silicon accommodated in the crucible and obtaining a silicon melt. Conditions for this step can be set in accordance with an amount of the polycrystalline silicon to be molten, and this step can be carried out based on a generally effected method for melting the polycrystalline silicon.

A cristobalitizing step according to the present invention is a step for leaving the silicon melt at a predetermined number of rotations of the crucible with a predetermined gas flow rate and a predetermined furnace pressure and producing cristobalite on a surface of the crucible while applying a magnetic field after the raw material melting step. Based on this step, the crucible reacts with the silicon melt, and the cristobalite is formed on an interface of the crucible and the silicon melt.

As leaving conditions in this case, it is preferable to adjust the number of rotations of the crucible to 3 rpm or less, adjust the gas flow rate to 250 L/min or less, and adjust the furnace pressure to 80 hPa or more. When such adjustment is carried out, the cristobalite is appropriately produced, and the dislocation generation can be further avoided. Additionally, to uniformly heat the crucible, the number of rotations of the crucible is preferably 0.1 rpm or more. Further, to prevent an oxide from adhering to an in-furnace component, the gas flow rate is preferably 100 L/min or more. Furthermore, to perform a depressurizing operation, the furnace pressure is preferably 300 hPa or less.

Moreover, it is preferable to carry out the cristobalitizing step for one hour or more. If the time for applying a magnetic field and leaving the silicon melt is one hour or more, it is a time that is sufficient to form the cristobalite on the surface of the crucible, and it is also a time that is sufficiently short in terms of efficiency without unnecessarily increasing a dead time that the silicon single crystal is not grown. Additionally, it is preferable to set a maximum time for leaving the silicon melt after the application of the magnetic field to 10 hours. If the time for leaving the silicon melt after the application of the magnetic field is 10 hours or less, it is possible to avoid a situation that formation of the cristobalite on the surface of the crucible advances too much and sufficient dissolution cannot be performed at the subsequent dissolving step.

Further, it is preferable to adopt a horizontal magnetic field as the magnetic field applied in this case and set the intensity of the center magnetic field to 3000 gausses or more and 5000 gausses or less. If the intensity of the center magnetic field is 3000 gausses or more, the leaving time can be reduced, which is industrially efficient. On the other hand, application of 5000 gausses or more is sufficient.

The dissolving step according the present invention is a step of partially dissolving the cristobalite by performing any one of an increase in number of rotations of the crucible, an increase in gas flow rate, and a reduction in furnace pressure beyond counterpart figures in the cristobalitizing step after the cristobalitizing step. Since the cristobalite is partially dissolved by a simple method, e.g., the increase in number of rotations of the crucible as described above, it is possible to avoid a case where a burden on an operator is raised or mistakes are increased at other complicated steps and time loss thereby occurs. This step enables appropriately dissolving the cristobalite formed on the surface of the crucible and suppressing the exfoliation during the pulling step, and hence the dislocation generation arising from the cristobalite can be prevented.

It is to be noted that the cristobalite is prevented from being entirely dissolved at this step. When the cristobalite is fully dissolved and the entire surface of the crucible becomes close to a state of initial amorphous silica, nucleation of the cristobalite is apt to newly occur if the magnetic field was applied at the pulling step, and there is a possibility that the newly produced cristobalite is exfoliated during the pulling step and the dislocation generation occurs.

Furthermore, at the dissolving step, it is preferable to apply the same magnetic field as that used in the cristobalitizing step. When the same magnetic field is applied in this manner, magnetization or demagnetization of the magnetic field, intensity control, and others do not have to be performed, and a dead time that the silicon single crystal is not manufactured can be shortened. In addition, it is preferable that intensity of the magnetic field applied at this time is the same as that in the cristobalitizing step, and it is preferable to adopt a horizontal magnetic field as the magnetic field to be applied and set intensity of a center magnetic field to 3000 gausses or more and 5000 gausses or less. Such a range is industrially efficient.

In this step, it is preferable to increase the number of rotations of the crucible to 5 rpm or more, preferable to increase the gas flow rate to 300 L/min or more, and preferable to reduce the furnace pressure to 70 hPa or less. When such adjustment is carried out, the cristobalite can be appropriately dissolved, and the dislocation generation can be further avoided. Additionally, when the number of rotations is too high, progress of dissolution is too fast, appropriate control over the dissolution is difficult, and hence 20 rpm or less is desirable as the number of rotations of the crucible. Further, when the flow rate is too high, the progress of the dissolution is too fast, the appropriate control over the dissolution becomes difficult, the flow rate does not have to be increased in view of economy, and hence 500 L/min or less is sufficient as the gas flow rate. Furthermore, when the depressurization is excessively performed, the progress of the dissolution is too fast, the appropriate control over the dissolution becomes difficult, and hence 10 hPa or more is preferable as the furnace pressure.

Moreover, the time of the dissolving step is preferably one hour or more and nine hours or less. If the time of the dissolving step is one hour or more, the dissolution can be sufficiently carried out so that the cristobalite cannot be exfoliated and, even if the cristobalite is exfoliated, the exfoliated cristobalite is sufficiently thin to be dissolved in the silicon melt before reaching the solid-liquid interface. Additionally, if the time of the dissolving step is nine hours or less, it is possible to avoid a situation where all of the cristobalite is dissolved and new nucleation of the cristobalite occurs.

The pulling step according to the present invention is a step of bringing a seed crystal into contact with a melt surface of the silicon melt after the melting step and pulling it upward to grow the silicon single crystal. This step can be performed by setting conditions in accordance with specifications of the silicon single crystal to be pulled and by using a generally adopted silicon single crystal pulling method.

EXAMPLES

The present invention will now be described in more details hereinafter with reference to examples and comparative examples, but the present invention is not restricted to the following examples.

Examples 1-1 to 1-13, and Comparative Example 1

Polycrystalline silicon accommodated in a crucible was molten to obtain a silicon melt, the silicon melt was left at the number of rotations (rpm) of the crucible, a gas flow rate (L/min), and a furnace pressure (hPa) shown in Table 1 while applying a horizontal magnetic field having center magnetic field intensity of 4000 gausses, and cristobalite was produced on a surface of the crucible (a cristobalitizing step). Then, the number of rotations of the crucible was increased as shown in Table 1 without changing the gas flow rate and the furnace pressure and the cristobalite was partially dissolved while applying the same horizontal magnetic field except Comparative Example 1 (a dissolving step). At last, a seed crystal was brought into contact with a melt surface of the silicon melt and pulled upward, thereby growing a silicon single crystal having a diameter of 300 mm. Table 1 shows the number of times of dislocation generation when 10 pieces of silicon single crystal were pulled under respective conditions.

TABLE 1

| | Cristobalitizing step | | | | | Dissolving step | | | | | Number of times of dislocation generation |
|---|---|---|---|---|---|---|---|---|---|---|---|
| | Number of rotations (rpm) | Flow rate (L/min) | Pressure (hPa) | Intensity of magnetic field (Gauss) | Time (h) | Number of rotations (rpm) | Flow rate (L/min) | Pressure (hPa) | Intensity of magnetic field (Gauss) | Time (h) | |
| Example 1-1 | 1 | 200 | 100 | 4000 | 5 | 6 | 200 | 100 | 4000 | 5 | 0 |
| Example 1-2 | 3 | 200 | 100 | 4000 | 5 | 6 | 200 | 100 | 4000 | 5 | 0 |
| Example 1-3 | 5 | 200 | 100 | 4000 | 5 | 6 | 200 | 100 | 4000 | 5 | 6 |
| Example 1-4 | 1 | 200 | 100 | 4000 | 0.5 | 6 | 200 | 100 | 4000 | 5 | 7 |
| Example 1-5 | 1 | 200 | 100 | 4000 | 1 | 6 | 200 | 100 | 4000 | 5 | 0 |
| Example 1-6 | 1 | 200 | 100 | 4000 | 8 | 6 | 200 | 100 | 4000 | 5 | 0 |
| Example 1-7 | 1 | 200 | 100 | 4000 | 10 | 6 | 200 | 100 | 4000 | 5 | 2 |
| Example 1-8 | 1 | 200 | 100 | 4000 | 5 | 3 | 200 | 100 | 4000 | 5 | 7 |
| Example 1-9 | 1 | 200 | 100 | 4000 | 5 | 5 | 200 | 100 | 4000 | 5 | 0 |
| Example 1-10 | 1 | 200 | 100 | 4000 | 5 | 6 | 200 | 100 | 4000 | 0.5 | 6 |
| Example 1-11 | 1 | 200 | 100 | 4000 | 5 | 6 | 200 | 100 | 4000 | 1 | 0 |
| Example 1-12 | 1 | 200 | 100 | 4000 | 5 | 6 | 200 | 100 | 4000 | 7 | 0 |
| Example 1-13 | 1 | 200 | 100 | 4000 | 5 | 6 | 200 | 100 | 4000 | 9 | 3 |
| Comparative Example 1 | 3 | 200 | 100 | 4000 | 10 | | | N/A | | | 10 |

In Comparative Example 1 where the cristobalitizing step alone is performed, the 10 pieces of silicon single crystal were all underwent the dislocation generation. It can be considered this dislocation generation occurred because the cristobalite was exfoliated to cause the dislocation generation since the dissolving step was not carried out. On the other hand, in Examples 1-1 to 1-13, the number of times of dislocation generation was successfully reduced. In particular, Examples 1-1 to 1-3 showed that the number of rotations of the crucible in the cristobalitizing step was preferably 3 rpm or less, and Examples 1-4 to 1-7 showed that the time of the cristobalitizing step was preferably one hour or more and 10 hours or less. Furthermore, Examples 1-8 to 1-9 showed that the number of rotations of the crucible in the dissolving step was preferably 5 rpm or more, and Examples 1-10 to 1-13 showed that the time of the dissolving step was preferably one hour or more and nine hours or less.

In particular, based on the above results, it is preferable to leave the silicon melt at the number of rotations that is 3 rpm or less for one hour or more to carry out the cristobalitizing step and then perform the dissolving step at the number of rotations that is 5 rpm or more for one hour or more and nine hours or less.

Examples 2-1 to 2-14, and Comparative Example 2

Polycrystalline silicon accommodated in a crucible was molten to obtain a silicon melt, the silicon melt was left at the number of rotations (rpm) of the crucible, a gas flow rate (L/min), and a furnace pressure (hPa) shown in Table 2 while applying a horizontal magnetic field having center magnetic field intensity of 4000 gausses, and cristobalite was produced on a surface of the crucible (a cristobalitizing step). Then, the gas flow rate was increased as shown in Table 2 without changing the number of rotations of the crucible and the furnace pressure, and the cristobalite was partially dissolved while applying the same horizontal magnetic field except Comparative Example 2 (a dissolving step). At last, a seed crystal was brought into contact with a melt surface of the silicon melt and pulled upward, thereby growing a silicon single crystal having a diameter of 300 mm. Table 2 shows the number of times of dislocation generation when 10 pieces of silicon single crystal were pulled under respective conditions.

more, and Examples 2-11 to 2-14 showed that the time of the dissolving step was preferably one hour or more and nine hours or less.

In particular, based on the above results, it is preferable to leave the silicon melt with the flow rate of 250 L/min or less for one hour or more to carry out the cristobalitizing step and then perform the dissolving step with the flow rate of 300 L/min or more for one hour or more and nine hours or less.

Examples 3-1 to 3-15, and Comparative Example 3

Polycrystalline silicon accommodated in a crucible was molten to obtain a silicon melt, the silicon melt was left at the number of rotations (rpm) of the crucible, a gas flow rate (L/min), and a furnace pressure (hPa) shown in Table 3

TABLE 2

| | Cristobalitizing step | | | | | Dissolving step | | | | | Number of times of dislocation generation |
|---|---|---|---|---|---|---|---|---|---|---|---|
| | Number of rotations (rpm) | Flow rate (L/min) | Pressure (hPa) | Intensity of magnetic field (Gauss) | Time (h) | Number of rotations (rpm) | Flow rate (L/min) | Pressure (hPa) | Intensity of magnetic field (Gauss) | Time (h) | |
| Example 2-1 | 1 | 220 | 100 | 4000 | 3 | 1 | 330 | 100 | 4000 | 5 | 0 |
| Example 2-2 | 1 | 250 | 100 | 4000 | 3 | 1 | 330 | 100 | 4000 | 5 | 0 |
| Example 2-3 | 1 | 280 | 100 | 4000 | 3 | 1 | 330 | 100 | 4000 | 5 | 7 |
| Example 2-4 | 1 | 220 | 100 | 4000 | 0.5 | 1 | 330 | 100 | 4000 | 5 | 6 |
| Example 2-5 | 1 | 220 | 100 | 4000 | 1 | 1 | 330 | 100 | 4000 | 5 | 0 |
| Example 2-6 | 1 | 220 | 100 | 4000 | 5 | 1 | 330 | 100 | 4000 | 5 | 0 |
| Example 2-7 | 1 | 220 | 100 | 4000 | 8 | 1 | 330 | 100 | 4000 | 5 | 0 |
| Example 2-8 | 1 | 220 | 100 | 4000 | 10 | 1 | 330 | 100 | 4000 | 5 | 2 |
| Example 2-9 | 1 | 220 | 100 | 4000 | 3 | 1 | 270 | 100 | 4000 | 5 | 7 |
| Example 2-10 | 1 | 220 | 100 | 4000 | 3 | 1 | 300 | 100 | 4000 | 5 | 0 |
| Example 2-11 | 1 | 220 | 100 | 4000 | 3 | 1 | 330 | 100 | 4000 | 0.5 | 6 |
| Example 2-12 | 1 | 220 | 100 | 4000 | 3 | 1 | 330 | 100 | 4000 | 1 | 0 |
| Example 2-13 | 1 | 220 | 100 | 4000 | 3 | 1 | 330 | 100 | 4000 | 7 | 0 |
| Example 2-14 | 1 | 220 | 100 | 4000 | 3 | 1 | 330 | 100 | 4000 | 9 | 3 |
| Comparative Example 2 | 1 | 220 | 100 | 4000 | 6 | | N/A | | | | 10 |

In Comparative Example 2 where the cristobalitizing step alone is performed, the 10 pieces of silicon single crystal were all underwent the dislocation generation. It can be considered this dislocation generation occurred because the cristobalite was exfoliated to cause the dislocation generation since the dissolving step was not carried out. On the other hand, in Examples 2-1 to 2-14, the number of times of dislocation generation was successfully reduced. In particular, Examples 2-1 to 2-3 showed that the gas flow rate in the cristobalitizing step was preferably 250 L/min or less, and Examples 2-4 to 2-8 showed that the time of the cristobalitizing step was preferably one hour or more and 10 hours or less. Furthermore, Examples 2-9 to 2-10 showed that the gas flow rate in the dissolving step was preferably 300 L/min or while applying a horizontal magnetic field having center magnetic field intensity of 4000 gausses, and cristobalite was produced on a surface of the crucible (a cristobalitizing step). Then, the furnace pressure was reduced as shown in Table 3 without changing the number of rotations of the crucible and the gas flow rate, and the cristobalite was partially dissolved while applying the same horizontal magnetic field except Comparative Example 3 (a dissolving step). At last, a seed crystal was brought into contact with a melt surface of the silicon melt and pulled upward, thereby growing a silicon single crystal having a diameter of 300 mm. Table 3 shows the number of times of dislocation generation when 10 pieces of silicon single crystal were pulled under respective conditions.

TABLE 3

| | Cristobalitizing step | | | | | Dissolving step | | | | | Number of times of dislocation generation |
|---|---|---|---|---|---|---|---|---|---|---|---|
| | Number of rotations (rpm) | Flow rate (L/min) | Pressure (hPa) | Intensity of magnetic field (Gauss) | Time (h) | Number of rotations (rpm) | Flow rate (L/min) | Pressure (hPa) | Intensity of magnetic field (Gauss) | Time (h) | |
| Example 3-1 | 1 | 200 | 60 | 4000 | 3 | 1 | 200 | 50 | 4000 | 5 | 7 |
| Example 3-2 | 1 | 200 | 80 | 4000 | 3 | 1 | 200 | 50 | 4000 | 5 | 0 |
| Example 3-3 | 1 | 200 | 100 | 4000 | 3 | 1 | 200 | 50 | 4000 | 5 | 0 |
| Example 3-4 | 1 | 200 | 100 | 4000 | 0.5 | 1 | 200 | 50 | 4000 | 5 | 6 |
| Example 3-5 | 1 | 200 | 100 | 4000 | 1 | 1 | 200 | 50 | 4000 | 5 | 0 |
| Example 3-6 | 1 | 220 | 100 | 4000 | 5 | 1 | 200 | 50 | 4000 | 5 | 0 |
| Example 3-7 | 1 | 200 | 100 | 4000 | 8 | 1 | 200 | 50 | 4000 | 5 | 0 |
| Example 3-8 | 1 | 200 | 100 | 4000 | 10 | 1 | 200 | 50 | 4000 | 5 | 3 |
| Example 3-9 | 1 | 200 | 100 | 4000 | 5 | 1 | 200 | 50 | 4000 | 5 | 0 |
| Example 3-10 | 1 | 200 | 100 | 4000 | 5 | 1 | 200 | 70 | 4000 | 5 | 0 |
| Example 3-11 | 1 | 200 | 100 | 4000 | 5 | 1 | 200 | 90 | 4000 | 5 | 7 |
| Example 3-12 | 1 | 200 | 100 | 4000 | 5 | 1 | 200 | 50 | 4000 | 0.5 | 7 |
| Example 3-13 | 1 | 200 | 100 | 4000 | 5 | 1 | 200 | 50 | 4000 | 1 | 0 |
| Example 3-14 | 1 | 200 | 100 | 4000 | 5 | 1 | 200 | 50 | 4000 | 7 | 0 |
| Example 3-15 | 1 | 200 | 100 | 4000 | 5 | 1 | 200 | 50 | 4000 | 9 | 2 |
| Comparative Example 3 | 1 | 200 | 100 | 4000 | 6 | | | N/A | | | 10 |

In Comparative Example 3 where the cristobalitizing step alone is performed, the 10 pieces of silicon single crystal were all underwent the dislocation generation. It can be considered this dislocation generation occurred because the cristobalite was exfoliated to cause the dislocation generation since the dissolving step was not carried out. On the other hand, in Examples 3-1 to 3-15, the number of times of dislocation generation was successfully reduced. In particular, Examples 3-1 to 3-3 showed that the furnace pressure in the cristobalitizing step was preferably 80 hPa or more, and Examples 3-4 to 3-8 showed that the time of the cristobalitizing step was preferably one hour or more and 10 hours or less. Furthermore, Examples 3-9 to 3-11 showed that the furnace pressure in the dissolving step was preferably 70 hPa or less, and Examples 3-12 to 3-15 showed that the time of the dissolving step was preferably one hour or more and nine hours or less.

In particular, based on the above results, it is preferable to leave the silicon melt with the pressure (low vacuum) of 80 hPa or more for one hour or more to carry out the cristobalitizing step and then perform the dissolving step with the pressure (high vacuum) of 70 hPa or less for one hour or more and nine hours or less.

It is to be noted that the cases where the increase in number of rotations of the crucible, the increase in gas flow rate, or the reduction in furnace pressure was performed have been described above, but these increases or reduction can be combined and the dissolving step can be effected in the present invention. Further, as regards the magnetic field, the same intensity of the magnetic field does not necessarily have to be used in the cristobalitizing step and the dissolving step.

It is to be noted that the present invention is not restricted to the foregoing embodiment. The foregoing embodiment is just an illustrative example, and any example that has substantially the same configuration and exercises the same functions and effects as the technical concept described in claims according to the present invention is included in the technical scope of the present invention.

The invention claimed is:

1. A method for manufacturing a silicon single crystal, the method comprising:
    a raw material melting step of melting polycrystalline silicon accommodated in a crucible to obtain a silicon melt; and
    a pulling step of bringing a seed crystal into contact with a melt surface of the silicon melt and pulling up the seed crystal to grow the silicon single crystal,
    wherein, after the raw material melting step and before the pulling step, there are performed:
    a cristobalitizing step of leaving the silicon melt at a predetermined number of rotations of the crucible with a predetermined gas flow rate and a predetermined furnace pressure to generate cristobalite on a surface of the crucible while applying a magnetic field; and
    a dissolving step of partially dissolving the cristobalite by carrying out any one of an increase in number of rotations of the crucible, an increase in gas flow rate, and a reduction in furnace pressure beyond counterpart figures in the cristobalitizing step,
    wherein the dissolving step is performed for one hour or more and nine hours or less.

2. The method for manufacturing a silicon single crystal according to claim 1,
wherein the same magnetic field as that in the cristobalitizing step is applied at the dissolving step.

3. The method for manufacturing a silicon single crystal according to claim 1,
wherein the number of rotations of the crucible is adjusted to 3 rpm or less at the cristobalitizing step.

4. The method for manufacturing a silicon single crystal according to claim 2,
wherein the number of rotations of the crucible is adjusted to 3 rpm or less at the cristobalitizing step.

5. The method for manufacturing a silicon single crystal according to claim 1,
wherein the gas flow rate is adjusted to 250 L/min or less at the cristobalitizing step.

6. The method for manufacturing a silicon single crystal according to claim 2,
wherein the gas flow rate is adjusted to 250 L/min or less at the cristobalitizing step.

7. The method for manufacturing a silicon single crystal according to claim 1,
wherein the furnace pressure is adjusted to 80 hPa or more at the cristobalitizing step.

8. The method for manufacturing a silicon single crystal according to claim 2,
wherein the furnace pressure is adjusted to 80 hPa or more at the cristobalitizing step.

9. The method for manufacturing a silicon single crystal according to claim 1,
wherein the cristobalitizing step is performed for one hour or more.

10. The method for manufacturing a silicon single crystal according to claim 2,
wherein the cristobalitizing step is performed for one hour or more.

11. The method for manufacturing a silicon single crystal according to claim 1,
wherein the number of rotations of the crucible is increased to 5 rpm or more at the dissolving step.

12. The method for manufacturing a silicon single crystal according to claim 2,
wherein the number of rotations of the crucible is increased to 5 rpm or more at the dissolving step.

13. The method for manufacturing a silicon single crystal according to claim 1,
wherein the gas flow rate is increased to 300 L/min or more at the dissolving step.

14. The method for manufacturing a silicon single crystal according to claim 2,
wherein the gas flow rate is increased to 300 L/min or more at the dissolving step.

15. The method for manufacturing a silicon single crystal according to claim 1,
wherein the furnace pressure is reduced to 70 hPa or less at the dissolving step.

16. The method for manufacturing a silicon single crystal according to claim 2,
wherein the furnace pressure is reduced to 70 hPa or less at the dissolving step.

17. The method for manufacturing a silicon single crystal according to claim 1,
wherein the magnetic field to be applied is a horizontal magnetic field and intensity of a center magnetic field thereof is set to 3000 gausses or more and 5000 gausses or less at the cristobalitizing step, the dissolving step, or both the cristobalitizing step and the dissolving step.

18. The method for manufacturing a silicon single crystal according to claim 2,
wherein the magnetic field to be applied is a horizontal magnetic field and intensity of a center magnetic field thereof is set to 3000 gausses or more and 5000 gausses or less at the cristobalitizing step, the dissolving step, or both the cristobalitizing step and the dissolving step.

* * * * *